US010515699B1

(12) United States Patent
Peterson et al.

(10) Patent No.: US 10,515,699 B1
(45) Date of Patent: *Dec. 24, 2019

(54) ERROR HANDLING FOR MATCH ACTION UNIT MEMORY OF A FORWARDING ELEMENT

(71) Applicant: Barefoot Networks, Inc., Santa Clara, CA (US)

(72) Inventors: Jay E. S. Peterson, San Francisco, CA (US); Patrick Bosshart, Plano, TX (US); Michael G. Ferrara, Palo Alto, CA (US)

(73) Assignee: Barefoot Networks, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,095

(22) Filed: Nov. 5, 2018

Related U.S. Application Data

(63) Continuation of application No. 15/682,323, filed on Aug. 21, 2017, now Pat. No. 10,127,983.

(60) Provisional application No. 62/419,451, filed on Nov. 8, 2016.

(51) Int. Cl.
| | | |
|---|---|---|
| *G11C 5/06* | (2006.01) | |
| *G11C 15/04* | (2006.01) | |
| *G11C 29/00* | (2006.01) | |
| *G11C 29/44* | (2006.01) | |
| *G11C 15/02* | (2006.01) | |

(52) U.S. Cl.
CPC .............. *G11C 15/04* (2013.01); *G11C 29/44* (2013.01); *G11C 29/76* (2013.01); *G11C 29/816* (2013.01); *G11C 15/02* (2013.01)

(58) Field of Classification Search
CPC ....... G11C 29/44; G11C 29/46; G11C 29/816; G11C 15/04
USPC ...................................... 365/63, 226
See application file for complete search history.

(56) References Cited

U.S. PATENT DOCUMENTS

| | | |
|---|---|---|
| 7,254,748 B1 | 8/2007 | Wright et al. |
| 7,685,570 B2 | 3/2010 | Draine et al. |
| 7,904,642 B1 | 3/2011 | Gupta et al. |
| 7,987,390 B2 | 7/2011 | Chandrasekaran |
| 8,279,871 B1 | 10/2012 | Sivan et al. |

(Continued)

OTHER PUBLICATIONS

Non-Published commonly Owned U.S. Appl. No. 15/682,316, filed Aug. 21, 2017, 45 pages, Barefoot Networks, Inc.

(Continued)

*Primary Examiner* — Connie C Yoha
(74) *Attorney, Agent, or Firm* — Compass IP Law PC

(57) ABSTRACT

A hardware forwarding element is provided that includes a group of unit memories, a set of packet processing pipelines, and an error signal fabric. Each packet processing pipeline includes several of match action stages. Each match action stage includes a set of match action tables stored in a set of unit memories. Each unit memory is configured to detect an error in the unit memory and generate an error output when an error is detected in the memory unit. The error signal fabric, for each match action stage, combines error outputs of the unit memories storing match tables into a first bit in the error signal fabric. The error signal fabric, for each match action stage, combines error outputs of the unit memories storing action tables into a second bit in the error signal fabric.

20 Claims, 14 Drawing Sheets

(56) References Cited

U.S. PATENT DOCUMENTS

| | | |
|---|---|---|
| 8,687,636 B1 | 4/2014 | Sivan et al. |
| 8,793,661 B1 | 7/2014 | Fei et al. |
| 9,762,261 B2 | 9/2017 | Zampaglione et al. |
| 9,940,191 B2 | 4/2018 | Abali et al. |
| 10,127,983 B1 * | 11/2018 | Peterson ............... G11C 29/022 |
| 2003/0142525 A1 | 7/2003 | Batson et al. |
| 2007/0022479 A1 | 1/2007 | Sikdar et al. |
| 2011/0255540 A1 | 10/2011 | Mizrahi et al. |
| 2013/0246698 A1 | 9/2013 | Estan et al. |
| 2014/0244966 A1 * | 8/2014 | Bosshart ................ H04L 49/90 |
| | | 711/206 |
| 2014/0268972 A1 * | 9/2014 | Bosshart ................ G11C 15/04 |
| | | 365/49.17 |
| 2015/0039823 A1 | 2/2015 | Chen |
| 2016/0283317 A1 | 9/2016 | Abali et al. |
| 2016/0285706 A1 | 9/2016 | Rao |
| 2017/0093986 A1 * | 3/2017 | Kim ....................... H04L 49/00 |

OTHER PUBLICATIONS

Non-Published commonly Owned U.S. Appl. No. 15/682,323, filed Aug. 21, 2017, 44 pages, Barefoot Networks, Inc.

* cited by examiner

US 10,515,699 B1

ERROR HANDLING FOR MATCH ACTION UNIT MEMORY OF A FORWARDING ELEMENT

CLAIM OF BENEFIT TO PRIOR APPLICATIONS

This application is a continuation application of U.S. patent application Ser. No. 15/682,323, filed Aug. 21, 2017. U.S. patent application Ser. No. 15/682,323 claims the benefit of U.S. Provisional Patent Application 62/419,451, filed Nov. 8, 2016. U.S. patent application Ser. No. 15/682,323 and U.S. Provisional Patent Application 62/419,451 are incorporated herein by reference.

BACKGROUND

Software defined networks (SDNs) decouple data and control planes. The data plane, which is also referred to as forwarding plane or user plane, is the part of the network that carries data packet (i.e., user packet) traffic. In contrast, the control plane in a network controls signaling traffic and routing.

In a forwarding element (e.g., a hardware switch or a hardware router), the data plane is the part of the architecture that decides what to do with the packets that arrive at the ingress interface. The data plane of a forwarding element is implemented by hardware and firmware while the control plane is implemented in software to provide for a more flexible management of network components from a central location.

Packet processing hardware in a forwarding element may use a match-action paradigm (e.g., that specified by the OpenFlow standard) for packet forwarding (e.g., switching, routing, etc.). In some hardware implementations of an OpenFlow switch, memories such as unit static random-access memory (SRAM) and ternary content-addressable memory (TCAM) are used to store the match and action data that defines the flow entries.

Memories may start degrading after deployment. Power surges, static electricity, excessive heat, manufacturing defects that may worsen during time are examples of the causes for memory degradation. Different techniques such as parity and error correcting code (ECC) are used to detect or correct memory errors.

Parity is an extra bit stored for each memory word to provide error detection. Every time memory is written, the parity is calculated and stored in the memory. Every time the TCAM is read, the parity is recomputed and compared with the stored parity. If there is a mismatch, there is an error. ECC adds additional bits to memory to provide redundant data such that the memory content can be recovered when a number of errors are introduced in the memory. For instance, a 2-bit ECC provides for correction of one faulty memory bit. Parity and ECC are, however, checked only when software does a read. Error detection using parity or ECC are software driven, which is a very slow operation.

BRIEF SUMMARY

Some embodiments provide novel ways of memory error detection and memory error correction in the data plane of a forwarding element. The forwarding element (e.g., a switch, router, or combination thereof) processes network packets according to one or more match-action tables in several match action stages. Some embodiments capture multiple errors and programmatically aggregate the errors. The aggregated error in some embodiments is propagated to subsequent match action stages to create an error propagation chain.

Some embodiments utilize TCAMs in the match action stages of the forwarding element. For instance, the match tables used in match-action stages are stored in TCAMs. The TCAM array in some embodiments supports a paired channel mode, where two TCAM tables compute a match in parallel and compare their results to generate an error signal. This error signal generates an interrupt and is used to optionally stop further processing of the packet that caused the error. The error signal is also optionally included as the error output of the match action stage, which it is consumed by subsequent match action stages.

Some embodiments provide a method of detecting errors in a data plane of a packet forwarding element that includes a group of physical TCAMs. The method configures a first set of physical TCAMs into a first logical TCAM. The method configures a second set of physical TCAMs into a second logical TCAM with the same number of physical TCAMs as the first logical TCAM. The method programs the first and second logical TCAMs to store the same set of data. The method requests a search for a particular content from the first and second logical TCAMs. The method generates an error signal when the first and second logical TCAMs do not produce a same search results.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description, and the Drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Software defined networks (SDNs) decouple data and control planes. The data plane, which is also referred to as forwarding plane or user plane, is the part of the network that carries data packet (i.e., user packet) traffic. In contrast, the control plane in a network controls signaling traffic and routing.

In a forwarding element (e.g., a hardware switch or a hardware router), the data plane is the part of the architecture that decides what to do with the packets that arrive at the ingress interface. The data plane of a forwarding element is implemented by hardware and firmware while the control plane is implemented in software to provide for a more flexible management of network components from a central location. Performing operations by the software in the control plane could, however, be time consuming and slow.

I. Memory Error Detection and Error Correction in the Data Plane of a Forwarding Element Some embodiments provide novel ways of memory error detection and memory error correction in the data plane of a forwarding element. The hardware forwarding element of some embodiments includes, among other elements, an ingress packet processing pipeline and an egress packet processing pipeline. Each of these pipelines includes a parser, a match-action unit (MAU), and a de-parser.

A. The Forwarding Element

Figure 1:
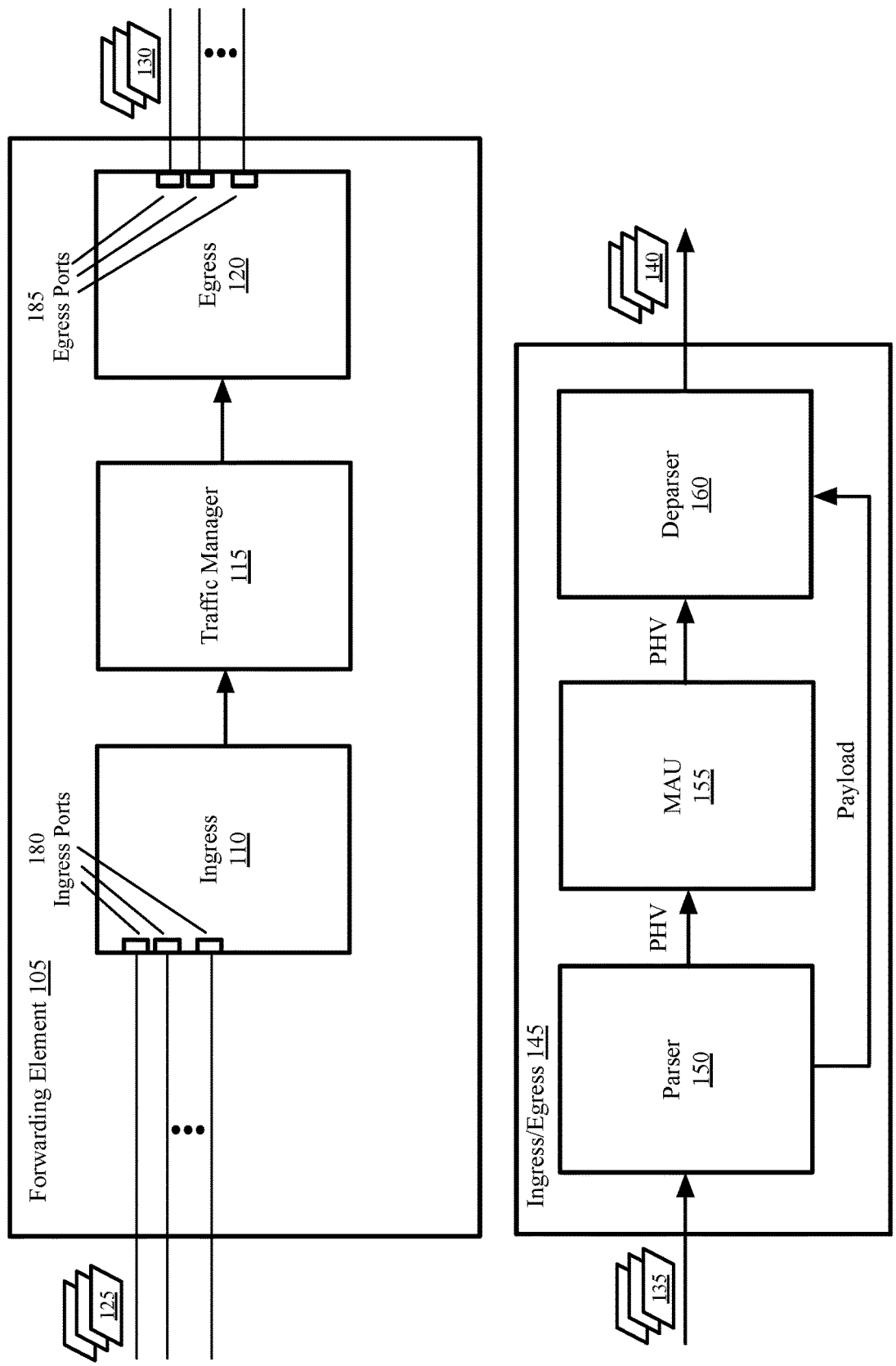
FIG. 1 conceptually illustrates a block diagram of a hardware forwarding element in some embodiments.

FIG. 1 conceptually illustrates a block diagram of a hardware forwarding element in some embodiments. As shown, the forwarding element 105 includes an ingress pipeline (or data path) 110, a traffic manager 115, and an egress pipeline 120. FIG. 1 also shows a block diagram 145 of an interface of the hardware forwarding element 105. Each one of the ingress 110 and egress 120 pipelines uses an interface similar to the interface 145. The interface includes a pipeline with three different units, namely a parser unit 150, a match action unit (MAU) 155, and a de-parser unit 160.

The traffic manager 115 in some embodiments receives the packets that are processed by the ingress pipeline and provides a large shared buffer (storage) that accommodates the queuing delays due to oversubscription of the output channels of the ingress de-parser. In some embodiments, the data buffer stores packet data, while pointers to that data are kept in different queues per channel. Each channel in turn requests data from the common data buffer using a configurable queuing policy. When pointers to packets reach the head of the queues, the packets are read out of the data buffer of the traffic manager 115 into the egress pipeline 120.

As shown, the ingress packets 125 are received at the ingress pipeline 110 through a set of ingress ports 180. The parser 150 of some embodiments receives the incoming packets and produces a packet header vector (PHV) as its output. In other words, the parser 150 separates the packet headers from the packet payload by extracting different fields of packet headers and storing them in the PHV.

In some embodiments, the PHV includes a set of different size registers or containers. For instance, in some embodiments the PHV includes sixty-four 8-bit registers, ninety-six 16-bit registers, and sixty-four 32-bit registers (for a total of 224 registers containing 4096 bits). Other embodiments may have any different numbers of registers of different sizes. In some embodiments, the parser 150 stores each extracted packet header in a particular subset of one or more registers of the PHV. For example, the parser might store a first header field in one 16-bit register and a second header field in a combination of an 8-bit register and a 32-bit register (e.g., if the header field is 36 bits long).

The PHV produced by the parser provides the input data to the match tables of the MAU. In some embodiments, the MAU 155 includes a set of match-action stages (e.g., 32 match-action stages). Each of these stages matches a particular set of header fields of a packet against a match table and takes an action based on the result of the match (e.g., assigning the packet to an output port and queue, dropping the packet, modifying one or more of the header fields, etc.). Based on the actions taken on different header data during the different stages of the MAU 155, the PHV that the MAU outputs to de-parser 160 might include the same header data as the PHV that the MAU received from the parser 150, or the output PHV might contain different data than the input PHV.

The output PHV is handed by the MAU 155 to the de-parser 160. The de-parser 160 reassembles the packet by putting back together the output PHV (that might or might not have been modified) that the de-parser receives from the MAU 155 and the payload of the packet that the de-parser receives directly from the parser 150.

The de-parser then sends the packets 140 out of the ingress/egress pipeline through a set of egress ports 185 (to the traffic manager 115 or out of the forwarding element, depending on whether it is the de-parser for the ingress pipeline or the egress pipeline). An output packet 130 may be the same packet as the corresponding input packet 125 (i.e., with identical packet headers), or it may have different packet headers compared to the input packet based on the actions that are applied to the packet headers in the ingress and egress pipelines (e.g., different header field values for certain header fields and/or different sets of header fields).

It should be understood that the illustrated blocks in forwarding element 105 are exemplary only. The ingress, traffic manager, and egress blocks are simplified for ease of description. For example, although the figure shows only one entry point to the ingress parser and one exit point from the egress de-parser, in some embodiments the input signals are received by many different input channels (e.g., 64 channels) and the output signals are sent out of the forwarding element from different output channels (e.g., 64 channels). Additionally, although for the illustrated forwarding element only one parser interface is shown for the ingress/egress pipeline 145, some embodiments employ numerous parser blocks (e.g., 16 parser blocks) that feed a match-action unit (MAU) in each pipeline.

B. Packet Forwarding Architecture

The forwarding element (e.g., a switch, router, or combination thereof) of some embodiments uses the OpenFlow protocol. The network packets in some embodiments are routed to, processed by, and routed from the forwarding element according to one or more match-action tables (also referred to as flow tables) that are part of the flow table architecture of the forwarding element. The flow tables include flow entries with (i) match conditions that are compared to the headers of the packets and (ii) actions to take if a packet meets the corresponding match conditions. The flow table architecture includes various memories (e.g., unit SRAMs, TCAMs, etc.) that store the flow table data, as well as arithmetic logic units (e.g., ALUs) and other supporting circuitry.

Figure 2:
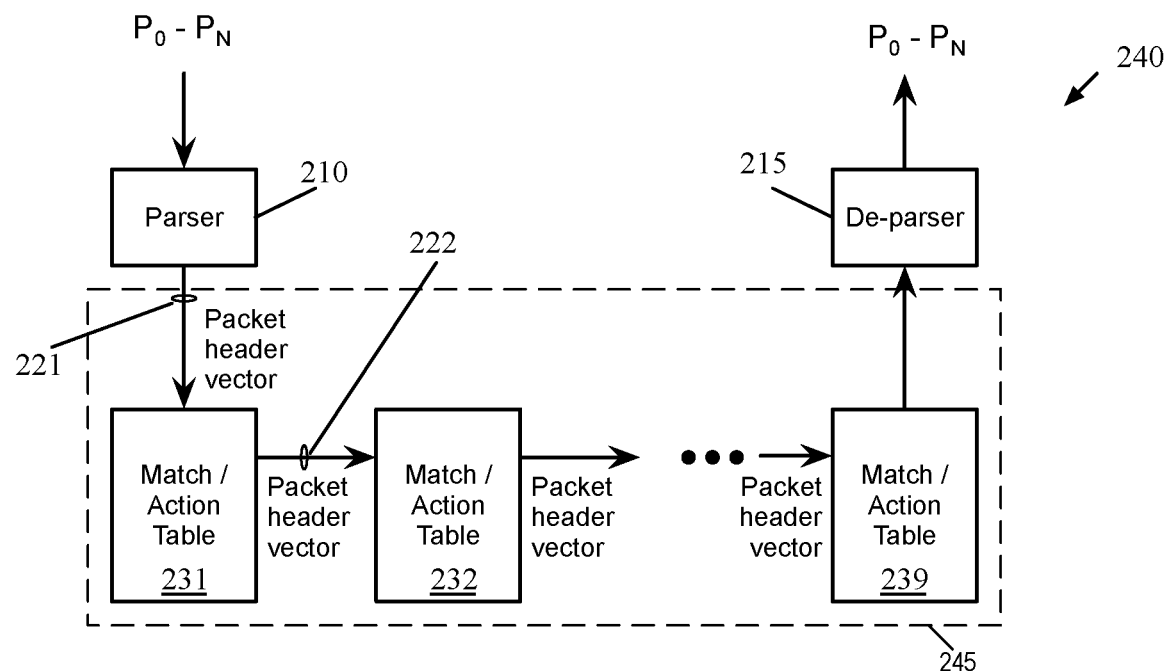
FIG. 2 conceptually illustrates the flow table architecture of a forwarding element of some embodiments.

FIG. 2 conceptually illustrates the flow table architecture 245 of a forwarding element 240 of some embodiments. The forwarding element includes a number of ports $P_0$-$P_N$. Each of the ports $P_0$-$P_N$ connects to a parser 210, which parses the packet headers to create an initial packet header vector 221. In some embodiments, the parser 210 identifies the fields at specific locations in the packet and aligns the packet header data in a format that allows the arithmetic logic units of the forwarding element hardware to identify the different header fields.

The forwarding element 240 then submits the packet header vector 221 to a successive sequence of match-action tables 231-239, which are implemented by the forwarding element (e.g., by a set of ALUs and SRAMs, or other hardware constructs). In some embodiments, the packet header vector 221 is submitted to the first match-action table 231 to determine whether a matching entry can be found in the table. If so, the forwarding element 240 applies the corresponding actions to the packet, which may involve manipulating the data of the packet header vector (e.g., modifying media access control (MAC) addresses, adding or removing virtual local area network (VLAN) tags or multiprotocol label switching (MPLS) labels, decrementing the packet time-to-live (TTL), etc.), specifying to which of several possible second match-action tables the packet should be submitted, outputting the packet to a particular port, dropping the packet, etc. The forwarding element then submits a subsequent packet header vector 222 to the next match-action table 232, which operates in the same manner as the first table 231. This subsequent packet header vector 222 may be the same as the first packet header vector 221, or may include one or more modified values based on the actions specified by the identified action from the first table 231.

Different embodiments implement match/action table stages of the forwarding element 240 differently. In some embodiments, selected modifications are postponed until after all match stages are executed. In some embodiments, a flow entry match specifies the address of the next table to be executed as a forward-only branch. Eventually, after all tables are consulted in this manner, the fields are presented to a de-parser 215, which realigns the fields into a packet, which is then output to the appropriate one of ports $P_0$ through $P_N$.

Figure 3:
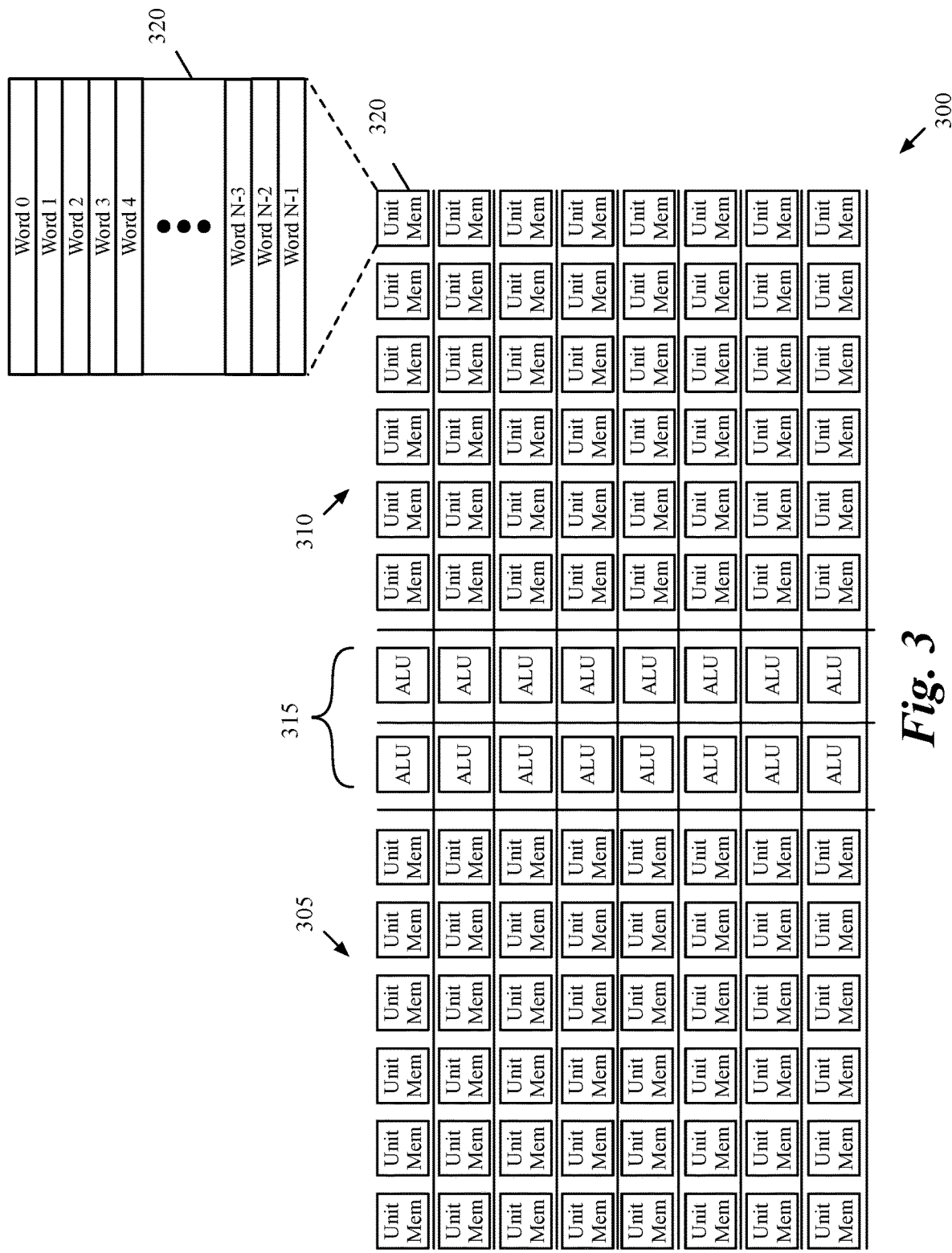
FIG. 3 conceptually illustrates such a grid of unit memories.

As mentioned above, the match-action tables of some embodiments are implemented using memory structures of the forwarding element. For example, some embodiments use pools of unit memories (e.g., SRAMs, TCAMs, etc.) to implement one or more match-action stages. In some embodiments, the unit memories are arranged in a grid of rows and columns. FIG. 3 conceptually illustrates such a grid 300 of unit memories. Specifically, this example shows 96 unit memories arranged in 16 logical rows, with each row associated with an ALU 315. The 16 logical rows are divided into two separate grids 305 and 310 of eight rows, having six columns in each of the two separate grids. It should be understood that the arrangement of memories shown in FIG. 3 is only one of many examples of the possible arrangements of unit memories to implement match-action tables in a forwarding element, and that the inventive concepts described herein are applicable to many such arrangements.

In some embodiments, each of these unit memories has a number of memory locations, or "words" that can be read by the ALUs. As shown for one of the unit memories 320, each memory includes N locations, from Word 0 to Word N–1. In some embodiments, each location has a fixed width based on the specific unit memories used in the grid 300, such as 64 bits, 128 bits, 256 bits, etc. The ALUs 315 in some embodiments read one memory location per unit memory in a given clock cycle. In some embodiments, separate sets of ALUs may be dedicated to performing packet modification operations or to performing packet state-related operations, such as statistics (counting), metering, etc. Some embodiments locate the state-related ALUs in the center of the grid of unit memories (as shown in FIG. 3), while locating the packet modification ALUs elsewhere in the hardware.

In some embodiments, each of the unit memories (also referred to as unit RAMs) has a designated function. For instance, a first unit memory might store match entries, while a second unit memory stores the action entries that correspond to the match entries of the first unit memory. In addition, the unit memories may store other data for a match-action based forwarding element, including meters (used to measure data flow rates), statistics (e.g., counters for counting packets, bytes, etc.), ternary indirection (TIND), etc. Since a TCAM search results in an address (instead of data), some embodiments program one or more unit RAMs as a TIND storage to store data associated with a TCAM address.

C. Data Plane Error Detection and Error Correction in RAM

Some embodiments capture multiple errors and programmatically aggregate the errors for each PHV that passes through the MAU. The aggregated error in some embodiments is propagated to subsequent stages to create an error propagation chain. Once errors are aggregated, the aggregated error can be used to disable predication and skip table processing. The aggregated error is also mapped to the action data bus by overriding immediate data in some embodiments. The action data bus is a bus that carries data to the ALUs and is used to modify the PHV. The aggregated error can further be sent on to the next MAU stage (and/or the de-parser). The aggregation and propagation varies based on inter-stage dependency and the error type's pipeline stage. The aggregated propagated error is combined down to a single bit per packet in some embodiments.

Further processing of a packet experiencing an error can be skipped by disabling predication and skipping match-action table processing. For instance, a packet experiencing error that will be dropped later in the pipeline can skip being counted in statistics (stats) or charged in metering. By mapping the error signal to the action data bus, a subsequent stage can match on a PHV container and perform an action specific to packets experiencing an error. This can be a simple action such as counting packets with errors to a more complicated behavior such as re-submitting a packet that found no active ports in its link aggregation (LAG). LAG combines multiple network connections in parallel to provide throughput and redundancy.

By forwarding the error to the next MAU stage, all errors for a given packet can be aggregated. However, if only one bit is used for combining multiple error sources and multiple stages, the source of the original error is lost. Some embodiments utilize multiple bits in order to maintain the state of multiple error chains. For instance, one bit to carry double bit ECC errors and one bit to carry selector LAG errors. Any number of additional chains (or wires) can be added to carry the state of additional errors, which require a compromise between the cost of the additional wiring and hardware versus carrying multiple error chains to identify the source of different errors.

Some embodiments send an error to the action data bus without forwarding the error to the next MAU stage. This effectively breaks the error chain so that aggregated errors in different classes are not mixed, but the previous error chain can no longer propagate to disable processing in subsequent stages or eventually be sent to the de-parser. In some embodiments, sending the error signal to the de-parser forces the packet to be dropped. Since there is a unique error indication per PHV, the MAU is able to react to errors at line rate bandwidth, which is a much faster time frame compared to a traditional interrupt-based scheme.

1. Sources of Error

Some embodiments map errors from different sources to the error signal. All error sources in some embodiments are combined into the current MAU stage's error output. The following are examples of the categories of errors detected in some embodiments: (i) input error from previous MAU stage, (ii) match phase errors, and (iii) action phase errors.

If errors are available at the beginning of the pipeline (e.g., from the previous pipeline stage), the errors can be used to disable predication, be mapped to the action data bus, and/or be combined into the output error of the current stage. If the errors are not available at the beginning of the pipeline, the errors can only be combined into the current stage's output error.

Match phase errors include TCAM paired table mismatch (generated by the TCAM array), hash generator parity error (generated at the data path), unit RAM double bit ECC error (generated by unit RAMs), and TIND double bit ECC error (generated by unit RAMs). All match phase errors can be used to disable the current stage's predication, be mapped to the action data bus, and be combined into the output error of the current MAU stage.

As described in the section titled "Data Plane Error Detection in TCAM," two TCAMs can be paired in order to detect errors. After the TCAM pair is set up, a TCAM match error control and status register (CSR) determines what to do when an error is detected. The hash generator parity error is enabled using a hash out control CSR and its error behavior is controlled with a hash generator parity error control CSR.

Double bit ECC errors from each unit RAM are classified into types and threads. A thread is either ingress or egress thread. In some embodiments, all exact match tables for a thread read and generate error in the same cycle and can be combined. The ingress pipeline might be different than the egress pipeline so where exact match may happen in egress may be different than ingress. Some embodiments provide two wires, one for exact match ingress and one for exact match egress.

For instance, a unit RAM is assigned to the exact match or TIND type using an EMM ECC error unit RAM control CSR or a TIND ECC error unit RAM control CSR. ECC errors from all RAM modules are combined into error signals per type (match, TIND, etc.) and per thread. Specifically for match phase errors, these are controlled using an EMM ECC error control CSR and a TIND ECC error control CSR.

Action phase errors include action data double bit ECC errors (generated by unit RAMs), all errors generated by synthetic two port tables, and parity errors while reading the instruction memory (IMEM). IMEM is the memory used to store instructions to feed very long instruction word (VLIW) ALUs that modify the PHVs. In some embodiments, some of these error types are generated very late in the pipeline (action phase is after match phase) and can only be combined into the MAU stage's output error. In these embodiments, these errors arrive too late to disable predication or to be mapped to the action data bus. When extra time is needed for a unit memory (or unit RAM) to run, some embodiments program an artificial pipeline with a delay in order to provide enough time for a possible error to be generated by the memory unit and propagated before the processing of the MAU pipeline completes.

Figure 4:
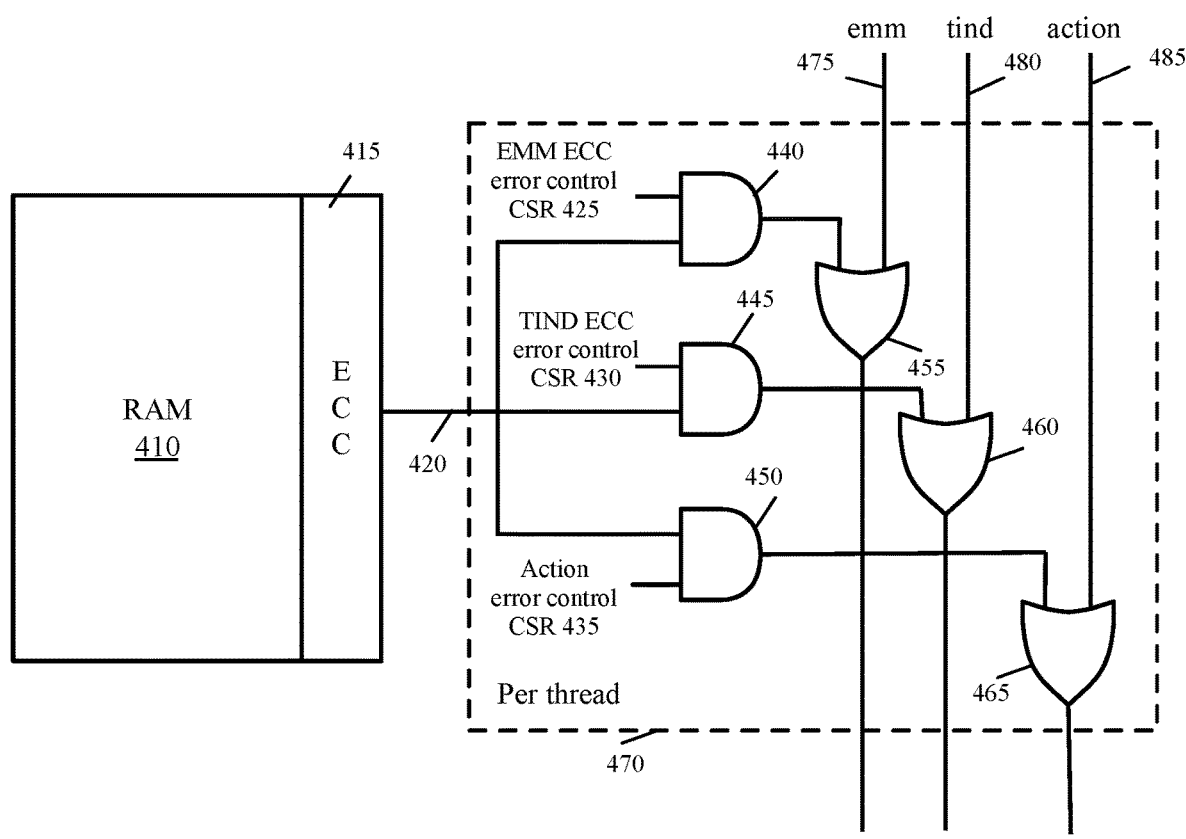
FIG. 4 conceptually illustrates an example of unit RAM error propagation fabric in some embodiments.

FIG. 4 conceptually illustrates an example of unit RAM error propagation fabric in some embodiments. The figure shows the mapping of the error bit from the unit RAM 410 to the error fabric 475-480. The unit RAM 410 in this example is programmed as either an exact match memory (EMM), a TIND memory, or an action memory. Using the CSRs described above, the error bit is logically ORed together into the corresponding error type 475-480 and thread 470.

The CSRs in this example include EMM ECC error control CSR 425, TIND ECC error control CSR 430, and action error control CSR 435. The CSRs are one-hot: depending on whether unit RAM 410 is programmed as EMM memory, TIND memory, or action memory. The signal from each of these CSRs is logically ANDed together (as shown by 440-450) with the ECC error signal 420 from the ECC 415 in RAM 410. The resulting signals are logically ORed together (as shown by 455-465) into the error types 475-480.

The error types in this example include EMM 475, TIND 480, and action 485. The masking mechanism in FIG. 4 allows the user to programmatically decide whether any actions are to be performed for each type of error. For instance, instead of the CSR bits to be one-hot, the user may decide to ignore certain type of errors in one or more MAU stages. For instance, the user may decide to ignore action data errors (i.e., the error is masked and not propagated) while an error on match data is important since it may result in the packet to be forwarded to a wrong port. The user, in this example, programs the CSR based on the type of the error. If the unit RAM 410 is programmed as an action memory, the corresponding CSR bit can be programmed to 0 in order to suppress the propagation of the error. On the other hand, if the unit RAM 410 is programmed as a match memory, the corresponding CSR bit is programmed to 1 in order to propagate any possible errors.

Each unit RAM in a row (e.g., a row of unit RAMs in FIG. 3) utilize a similar set of CSRs to merge their errors to the thread 470. For instance, the EMM error from another unit RAM in the same row as unit RAM 410 is first entered as an input to an AND gate with the EMM CSR set to 1. The output of the AND gate is then an input to the OR gate 455 in order to merge the error to the EMM error thread 475. Errors generated by each row of unit RAMs (e.g., each row of unit RAMs in FIG. 3) are combined (e.g., using another set of OR gates) in order to combine the errors from different unit RAM rows.

2. Error Combination

FIG. 4 showed the errors generated by unit RAMs. Other errors generated by other hardware components (e.g., TCAM paired table mismatch generated by the TCAM array, hash generator error generated in the data path, etc.) are combined into individual threads for each error source using a mechanism similar to what was described in FIG. 4 for unit RAM errors. All of the error sources in some embodiments converge at an error aggregation block referred to as match central, where a combination of CSRs control the errors enabling, combination, and propagation. Each error source provides one bit of error status per thread.

Match phase errors in some embodiments are delayed so that they are all valid in the subsequent predication cycle. After being delayed, match phase errors are separately gated by their three possible actions, which include disable predication (i.e., disable table processing), map to the action data bus that feeds data to a group of VLIW ALUs (in order to be available in the PHV, e.g., to be included in the packet header), or combine with the output error chain of the MAU stage. The gated errors are merged per type. These actions are controlled using TCAM match error control CSR, TIND ECC error control CSR, hash generator parity error control CSR, EMM ECC parity control CSR, and previous stage error control CSR.

To generate the final error output for the MAU stage, the match errors available in the predication cycle are gated with the corresponding "output error enable" CSR. At this point, the errors are optionally combined with the action data, synthetic two port, and IMEM parity errors.

Figure 5:
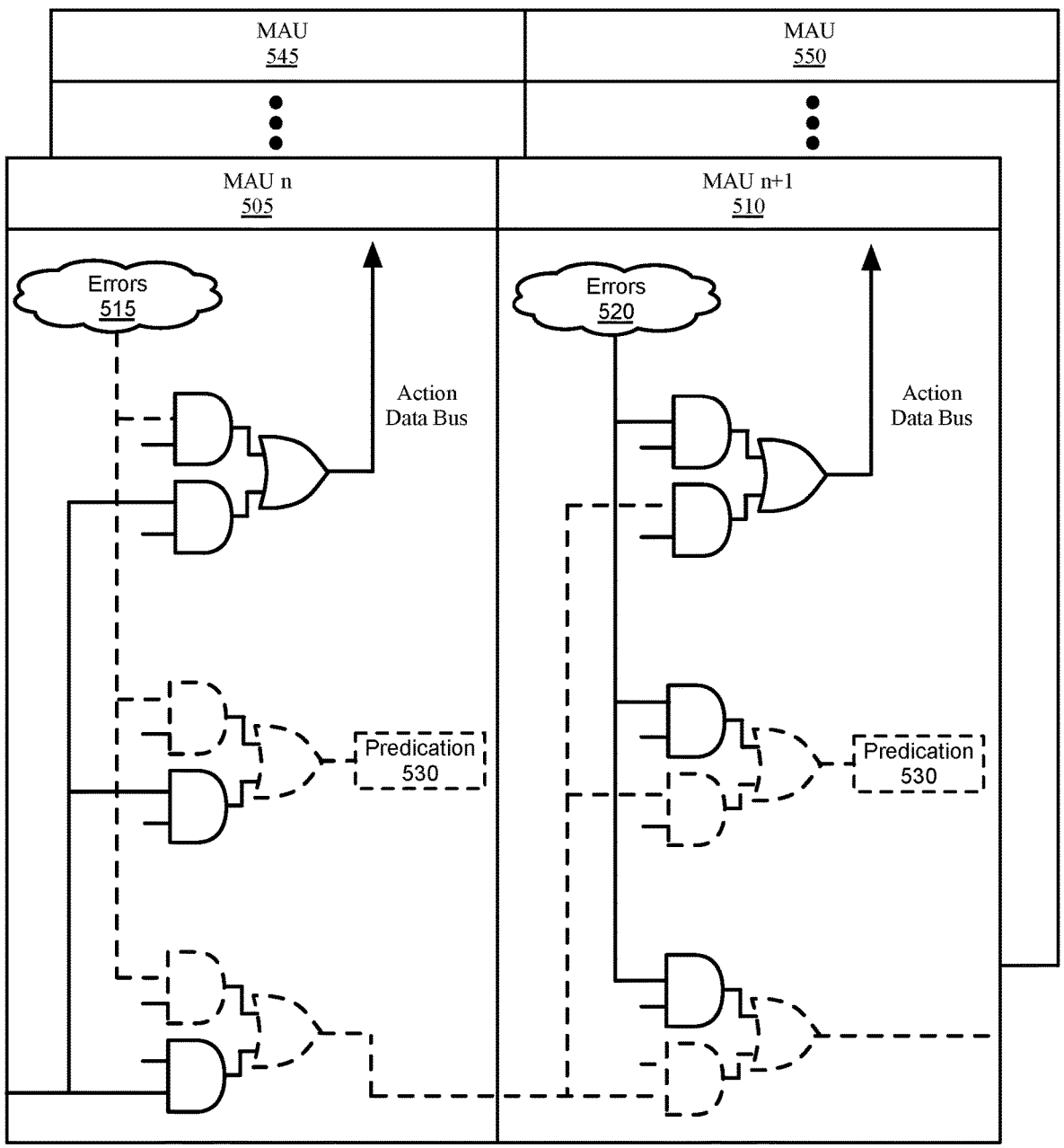
FIGS. 5 and 6 conceptually illustrate two possible error aggregation and propagation scenarios in some embodiments.
Figure 6:
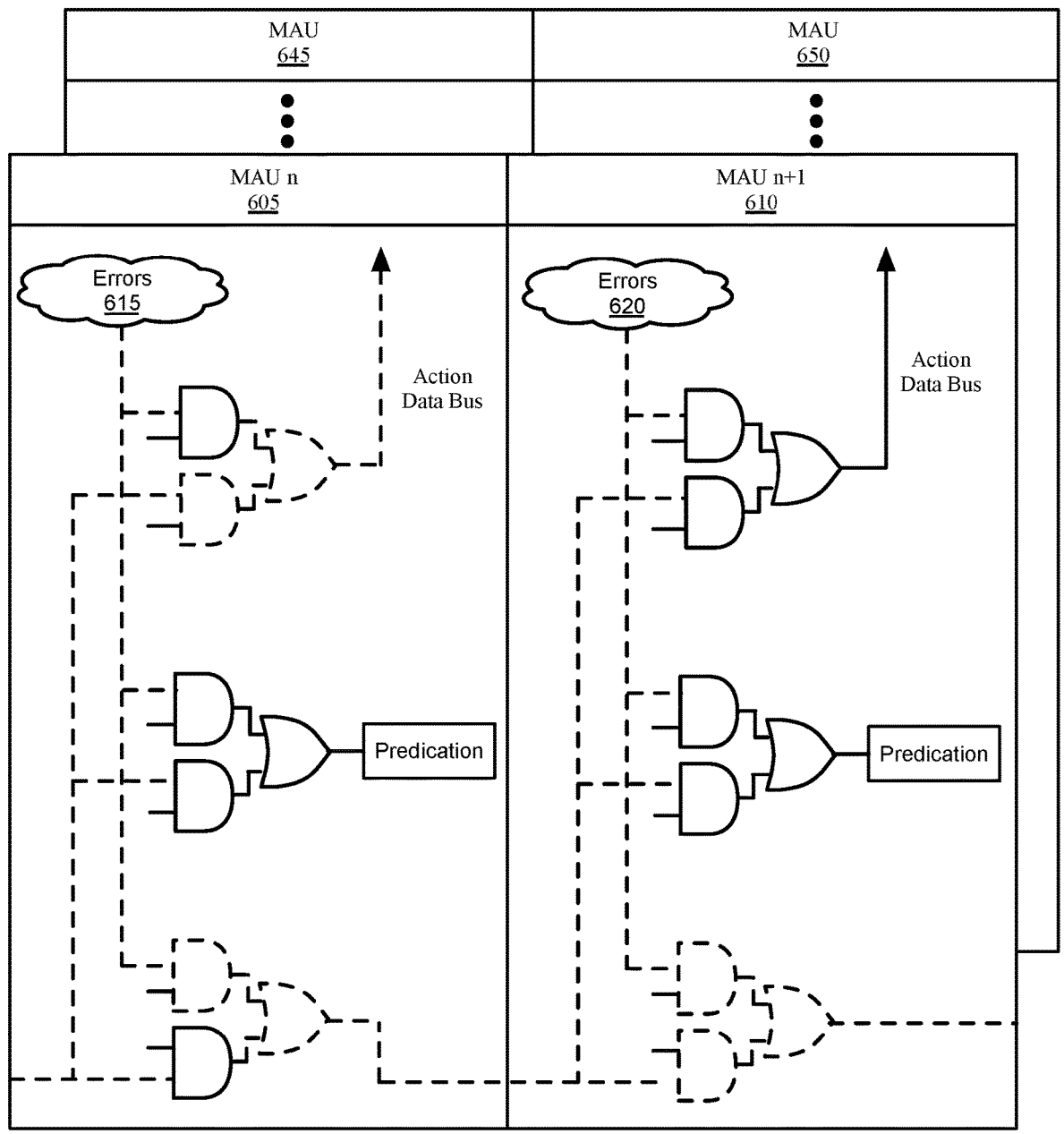

FIGS. 5 and 6 conceptually illustrate two possible error aggregation and propagation scenarios in some embodiments. In these figures, a dashed line indicates that an error source can be sampled. A dashed AND gate determines if the error is included in any further processing. A dashed OR gate and predication indicates forwarding and processing of the errors. For simplicity, the CSRs that are connected to the AND gates are not shown in these figures.

FIG. 5 shows an MAU n 505 that does not receive any error from a previous stage (as shown by no dashed lines entering the stage). However, the MAU's internally generated errors 515 are set up to halt predication 530 and are forwarded onto the next stage, MAU n+1 510. Predication 530 (or table selection logic) determines which match-action table is going to be processed after the match-action table that is currently being processed. Halting predication for a stage would prevent a packet that caused error to affect the collected statistics and meters.

MAU n+1 does not have any error generation within its stage (as shown, there are no dashed lines from errors 520 into MAU n+1). MAU n+1 propagates the error signal from the previous stage to halt predication and pass onto the next stage. The figure demonstrates an error propagation chain, where processing is halted for the PHV in subsequent stages.

Although the MAU stages operate serially, the stages generate parallel error chains. In other words, the MAUs can have multiple error chains propagating at the same time through different MAU stages. This is conceptually shown in FIG. 5 with MAU stages 505-510 propagating one error chain and MAU stages 545-550 (e.g., MAU stages that are earlier than stages 505-510) propagating a different error chain. Each parallel processing chain may be used to handle a different type of error.

FIG. 6 shows how a previous stage's error is mapped to the action data bus in MAU n 605, but is not propagated onto the next stage 610. Instead, the internal errors of MAU n are sent to the next stage, where they combine with errors generated within MAU n+1 610 before propagating to the next stage. The figure demonstrates the breaking of an error propagation chain and the beginning of a new chain, with the initial chain's error signal being mapped to the action data.

Similar to FIG. 5, several MAU processing error chains in FIG. 6 can be propagated in parallel (as conceptually shown by 645 and 650 that are propagating a different error chain in parallel with 605 and 610). Each parallel error chain may be used to handle a different type of error.

Figure 7:
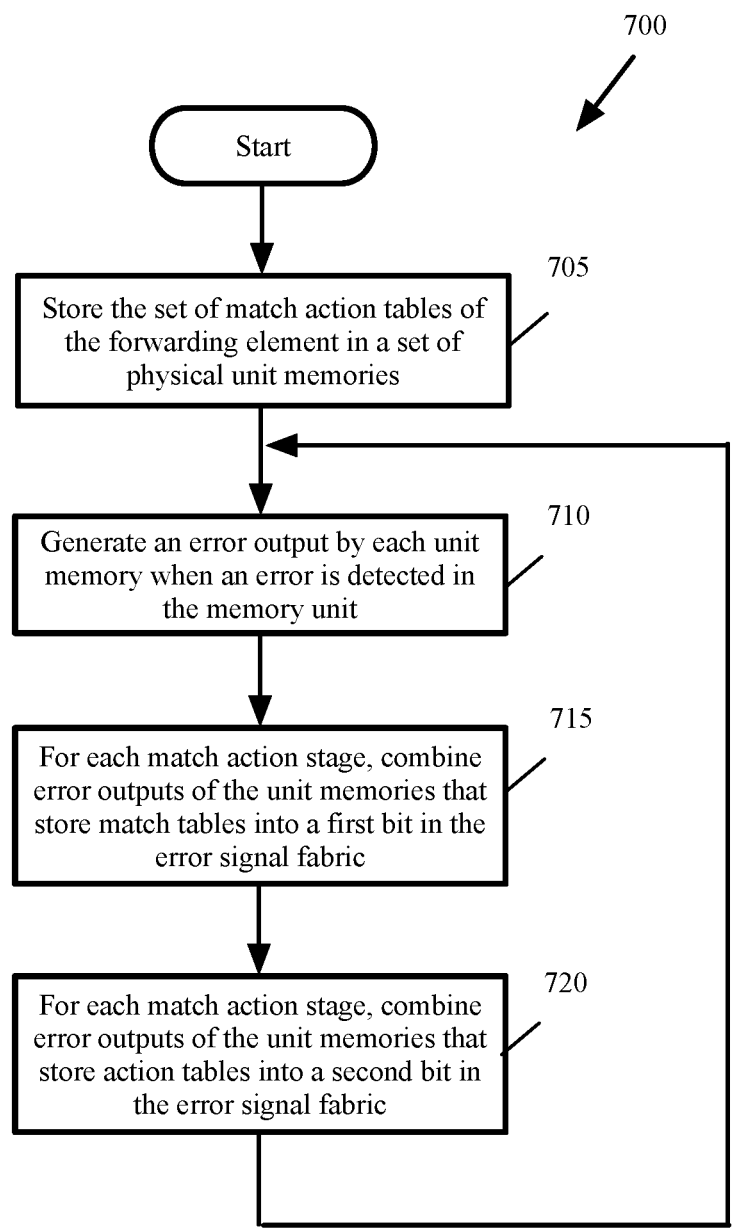
FIG. 7 conceptually illustrates a process for detecting unit memory errors in the data plane of a hardware forwarding element in some embodiments.

FIG. 7 conceptually illustrates a process 700 for detecting unit memory errors in the data plane of a hardware forwarding element in some embodiments. The hardware processing element includes several physical unit memories, an error signal fabric, and a set of packet processing pipelines. Each packet processing pipeline includes several match action stages. Each match action stage includes a set of match action tables.

As shown, the process stores (at 705) the set of match action tables in a set of physical unit memories. The process generates (at 710) an error output by each unit memory when an error is detected in the memory unit.

The process, for each match action stage, combines (at 715) error outputs of the unit memories that store match tables into a first bit in the error signal fabric. The process, for each match action stage, combines (at 720) error outputs of the unit memories that store action tables into a second bit in the error signal fabric. The process then proceeds to 710, which was described above.

II. Data Plane Error Detection in TCAM

Some embodiments utilize TCAMs in the MAU. For instance, the match tables used in match-action stages of the MAU are stored in TCAMs. A content-addressable memory (CAM) uses a data word to search the contents of the entire memory to determine whether the word is stored anywhere in memory. CAM allows searching the memory based on the stored content. A table stored in CAM is searched in parallel to determine whether a particular content value matches any table entries stored in memory and when one or more matches are found CAM returns a list of the storage addresses where a match is found.

In contrast, traditional computer memory such as random access memory (RAM) uses the address of data to retrieve content stored in the memory. Searching to determine whether a table stored in RAM includes a particular value would require repeatedly retrieving the content stored in different memory addresses, comparing the content with the value, and repeating memory accesses until either a match is found or it is determined that the table does not store the particular value.

In binary CAM, each bit of stored data corresponds to a binary state of 0 or 1. Ternary content-addressable memory (TCAM) allows an additional state of "don't care" or "wildcard," represented as "X". For instance, an 8-bit TCAM can store a value of 01101XXX, which matches any of the values 01101000, 01101001, 01101010, 01101011, 01101100, 01101101, 01101110, and 01101111. TCAMs perform a ternary match. Each bit position can match 0, 1, or "don't care". Two bits are needed to represent each ternary bit (trit).

The use of the wildcard state allows fewer entries stored in TCAM. A typical application of TCAMs is in networking equipment such as a router where each address has two parts: a network address that varies in size depending on the sub-network configuration and a host address that uses the remaining bits in the address. The router maintains a routing table that includes "don't care" for the host address portion of the addresses. Each entry has a corresponding priority. The routing table also stores the routing information corresponding for each stored entry. Looking up the TCAM against a network address in an incoming packet results in the corresponding routing information. TCAM hardware compares the incoming value against all entries in the table in parallel. TCAM hardware returns the matching results for the highest priority entry.

A. TCAM Arrays

Figure 8:
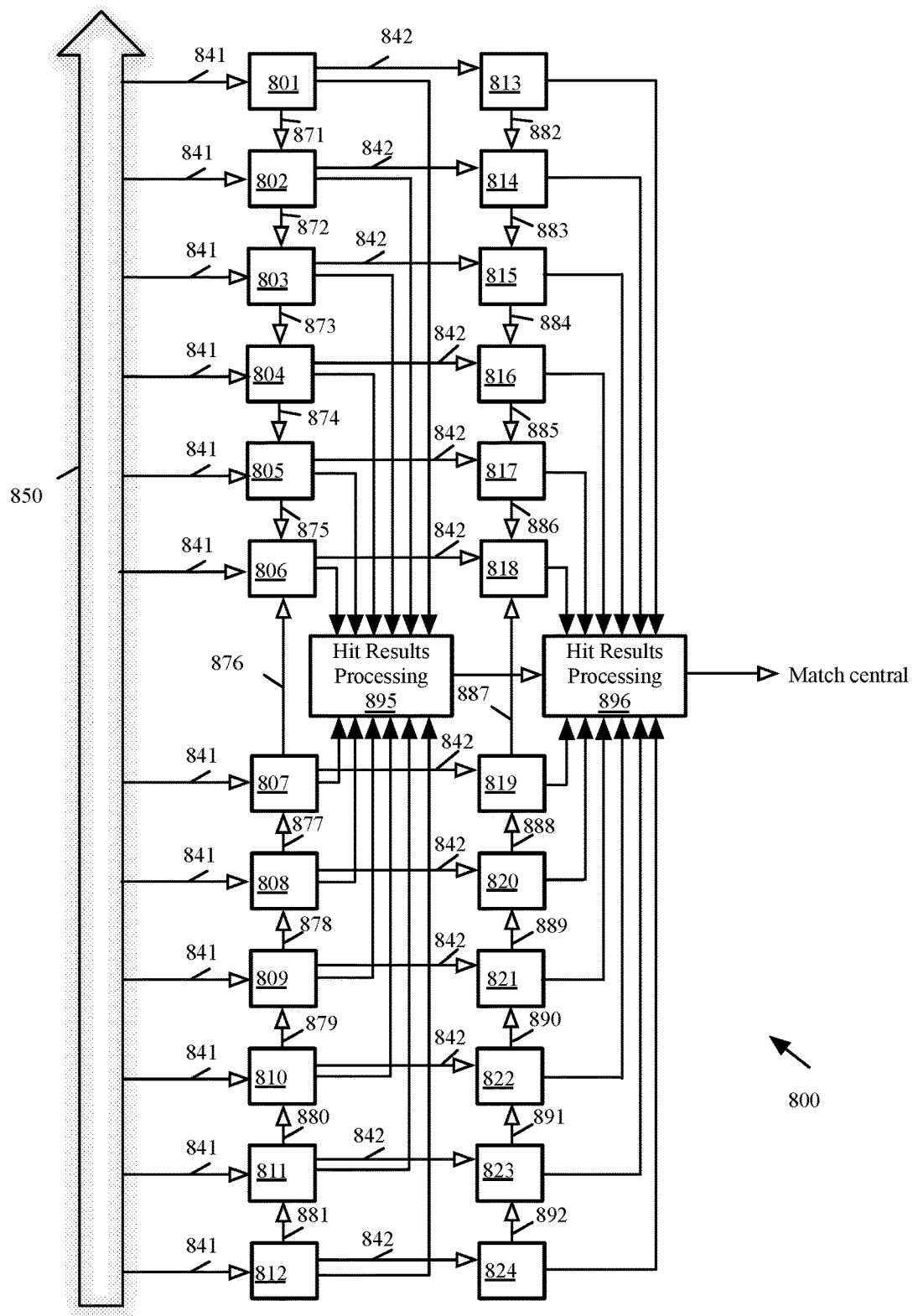
FIG. 8 conceptually illustrates a TCAM array in some embodiments.

FIG. 8 conceptually illustrates a TCAM array 800 in some embodiments. TCAM array 800 is used in each MAU stage in some embodiments. As shown, the TCAM array 800 includes 24 TCAM blocks 801-824 in each MAU stage. Each TCAM block 801-824 includes a TCAM and peripheral circuitry. Details of each TCAM block are described further below by reference to FIG. 9.

The TCAM are organized in multiple rows and columns. Each TCAM is 512 words by 47 bits in some embodiments. It should be understood that FIG. 8 describes an exemplary TCAM array of some embodiments and other arrangements are used in TCAM arrays in other embodiments.

Multiple adjacent TCAMs in the same column can cooperate to form a wider match word, up to the full width of the all TCAMs in a column. In the example of FIG. 8, each TCAM word includes 47 trits, organized as two words of 47 bits each. The two words are referred to as Word0 and word1. Each TCAM word also includes two bits or a trit for parity.

The search data 841 is received into each TCAM row from the search data bus 850. The search lines provide the search data to the TCAMs. As shown, there are match chain input/outputs 871-892 between TCAMs, and hit result processing circuitry 895-896 in the center of the TCAM array 800. The match chain input/outputs indicate whether the search data matches the TCAM content.

Figure 9:
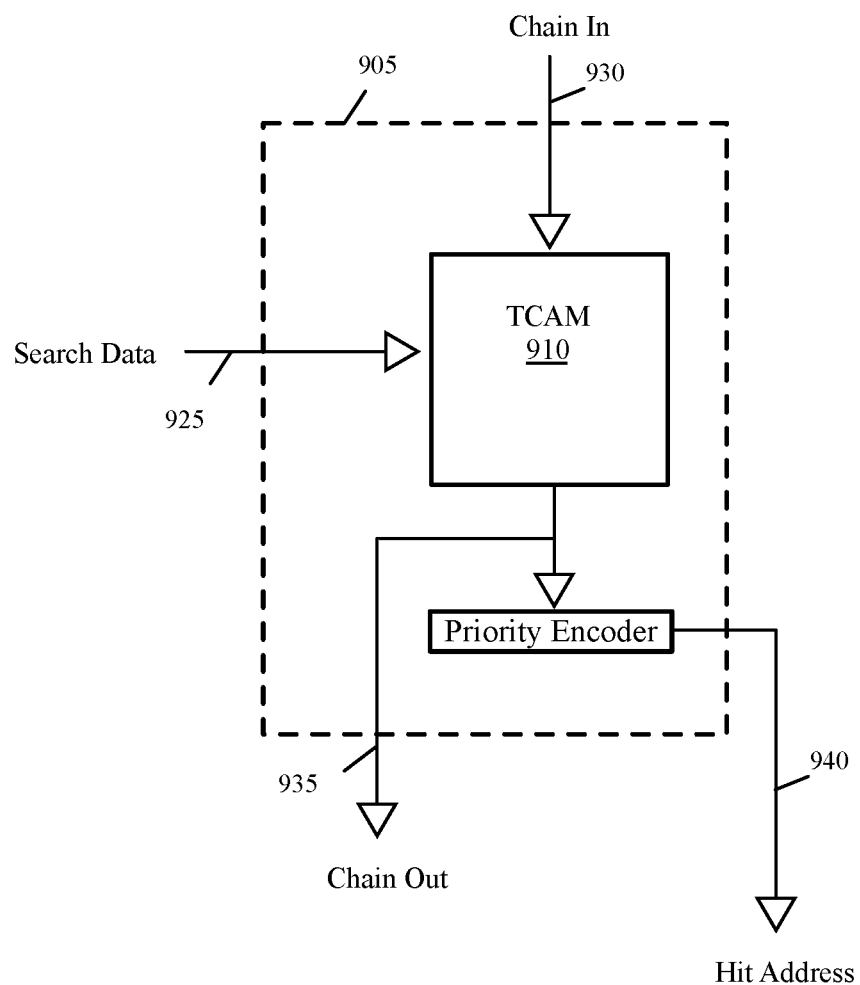
FIG. 9 conceptually illustrates details of a TCAM block in some embodiments.

FIG. 9 conceptually illustrates details of a TCAM block in some embodiments. The circuitry inside the dashed line 905 shows the details of each TCAM block 801-824 in FIG. 8. TCAM 910 has a read/write interface (not shown) separate from the match interface, such that read or write operations can occur simultaneously with matching operations. TCAM 910 receives search data 925 and chain in data 930. Chain in 930 and chain out 935 correspond to match chain input/outputs 871-892 in FIG. 8. The hit address 940 is connected to the input of hit result processing circuitry 895-896 in FIG. 8.

B. TCAM Match Merging

In some embodiments, the TCAMs in a TCAM array (such as TCAM array 800 in FIG. 8) can be arbitrarily assigned to a logical TCAM. For instance, some embodiments allow any of up to 8 logical TCAMs to be formed by assigning a set of TCAMs to each logical TCAM. Grouping of physical TCAMs in logical TCAMs is optional (i.e., is determined by the user based on a particular application). Each logical TCAM can have one or more physical TCAMs. Not every TCAM in the TCAM array needs to be included in a logical TCAM.

Within each logical TCAM, the individual TCAM modules are prioritized. Each of the physical TCAMs in a TCAM array (e.g., the TCAMs in TCAM blocks 801-824 in FIG. 8) has a 6-bit priority data provided by a TCAM mode register. These bits are added as most significant bits (MSBs) on top of the 9 bits of match address.

Each physical TCAM generates a hit signal, a 15-bit match address (6-bits priority data+9-bits entry). The combination and prioritization of the outputs of multiple TCAMs is done in two steps. First between the physical TCAMs in a column, where a result from a higher row always wins. Second, between the two columns, where the higher column always wins.

All hit match addresses in a column are brought to the vertical middle of the TCAM column, where there is a gap between rows 5 and 6, to determine logical TCAM membership and priority. These per-TCAM results are shown as the input lines to hit result processing circuitries 895-896 in FIG. 8.

For each logical TCAM, there is an n-bit (n is the number of rows in the TCAM array) configuration register that specifies which physical TCAMs in the column belong to that logical entity. For instance, in a TCAM array with 12 rows, the configuration register has 12 bits. When merging the result for the column, each logical TCAM returns the hit, match address, and action bit payload from the physical TCAM with the highest row that is a member of that logical TCAM and experienced a hit.

Figure 10:
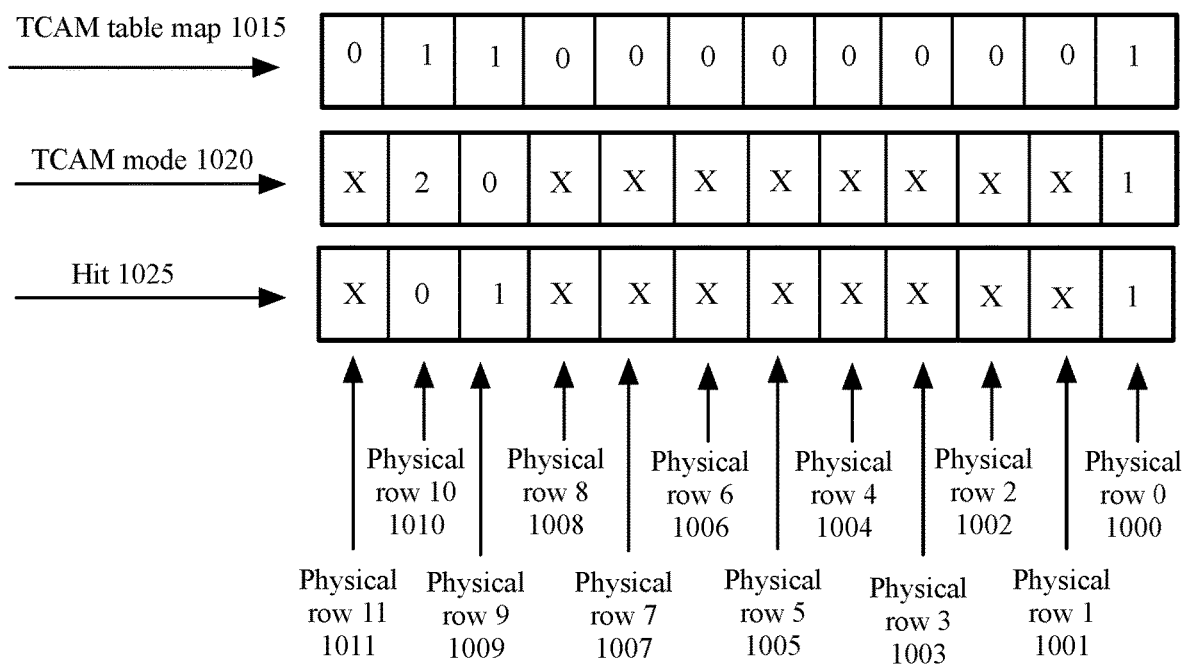
FIG. 10 conceptually illustrates an example column merge for logical TCAM Table 0.

FIG. 10 conceptually illustrates an example column merge for logical TCAM Table 0. The figure shows an example of the contents of several registers associated with logical TCAM Table 0. The columns 1000-1011 in each register shows the value associated with a particular physical row of a TCAM array. For instance, column 1000 shows the values associated with the first row of TCAM array 800 in FIG. 8 (i.e. the row that includes TCAM blocks 801 and 813).

"TCAM table map" configuration register 1015 shows which rows of the TCAM array are used to configure logical TCAM table 0. In this example, rows 0, 9, and 10 (with a corresponding bit value of 1 in the configuration register) are used to configure TCAM table 0. As described above, for a TCAM array such as TCAM array 800 in FIG. 8 that has n rows of TCAMs, "TCAM table map" configuration register has n valid bits. The hit register 1025 shows which physical TCAMs have generated a hit (as indicated by a value of 1 in the corresponding column of the hit register). TCAM mode register 1020 is used (as described above) to generate the 6-bit priority data portion of the hit address.

The followings are steps to find the highest priority match within the column. First the physical TCAMs that are part of the logical TCAM. In this example, logical TCAM 0 includes physical TCAMs in rows 0, 9, and 10 (as identified by values of 1 in the corresponding columns of TCAM table map configuration register 1015. Next, the match address of the physical TCAM with the highest row that experienced a hit is determined.

In this example, the hit register 1025 shows that two physical TCAMs 0 and 9 both generated a hit. The physical TCAM 9, which is in a higher row has the higher priority. The match address is given by the value of TCAM mode register 1020 at column 9 (in this example 6 bits of all 0's) concatenated to the 9-bit match address provided by physical TCAM 9.

Registers 1015-1025 are repeated 8 times per column. For each logical TCAM the corresponding TCAM table map configuration register is used and hit signals, action outputs, and match address outputs are generated. This generates two possible match results for each logical TCAM table, one from each column. Match merging is completed by prioritizing a hit in column 1 over column 0.

C. TCAM Paired Channel Error Detection Mode

Each word in a TCAM can include parity information. Each parity bit in a word indicates whether the number of bits with a 1 value is even or odd. Since a TCAM bit can have values of 0, 1, and "don't care", two bits are required for TCAM parity. There can be periodic reads to TCAM words to determine whether any bits are corrupted. Every time memory is written, the parity is calculated and stored in the memory. Every time the TCAM is read, the parity is recomputed and compared with the stored parity. If there is a mismatch, there is an error.

Parity is, however, checked only when software does a read which is a very slow operation. Each read performed in a cycle gets 1 of 512 words of one of the TCAMs. In addition, parity protects reads but it does not protect matches. Determining the validity of the match logic in an MAU is very important since the match logic determines what actions are performed on a packet.

The TCAM array in some embodiments supports a paired channel mode, where two logical TCAM tables compute a match in parallel and compare their results to generate an error signal. This error signal generates an interrupt and is sent to match central to optionally stop further processing of the PHV that caused the error. The error signal is also optionally included onto the MAU top-level error output, where it is consumed by subsequent MAU stages or the de-parser.

Logical TCAM tables in some embodiments are statically paired as table 0 with 4, 1 with 5, 2 with 6, and 3 with 7. Each channel pair is individually enabled and associated with a thread using a "TCAM error detect enable" configuration register. As a result, the choice to protect a table does not need to be decided until the compile time. It is up to the user to decide which tables are important enough to require this added protection against match errors. Since the MAU's TCAM array is a fungible resource, the user can reduce the extra cost of this protection.

Figure 11:
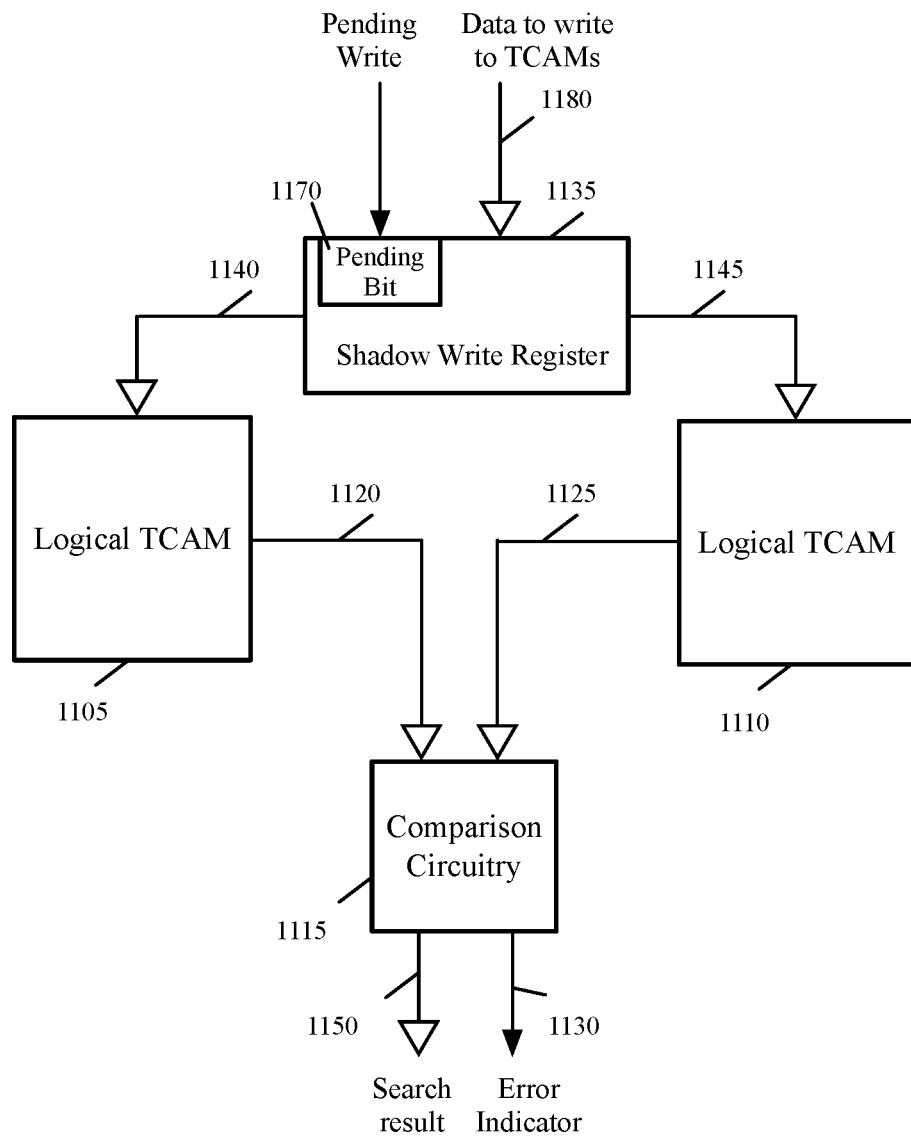
FIG. 11 conceptually illustrates pairing of identical logical TCAM to provide error detection in a data plane of a forwarding element in some embodiments.

Some embodiments double the resources needed for performing a TCAM's operations in order to provide error detection functionality. These embodiments provide a mechanism to perform error detection for all 512 words of a TCAM at once. FIG. 11 conceptually illustrates pairing of identical logical TCAM to provide error detection in a data plane of a forwarding element in some embodiments.

Each logical TCAM 1105-1110 includes an identical number of TCAM blocks. The TCAMs in each paired logical TCAM have the same information as the other logical TCAM. For instance, logical TCAM 1105 can include TCAM 802 (shown in FIG. 8) and logical TCAM 1110 can include TCAM 816. Each logical TCAM can have more than one TCAM. For instance, logical TCAM 1105 can include TCAMs 807, 809, and 810 and logical TCAM 1110 can include TCAMs 819, 821, and 822.

The two logical TCAMs 1105 and 1110 include the same number of TCAMs and are programmed to have the same information. Each TCAM performs the search operations (which is done in parallel over all words simultaneously) and selects the highest priority result as the search result. The comparison circuitry 1115 compares the two results 1120-1125 and generates an error signal 1130 to indicate whether or not the two results are the same.

For instance, each logical TCAM hardware 1105-1110 searches the content stored in the TCAM. If the search is successful, the hardware in each logical TCAM generates a signal (not shown) that indicates a match and returns the result with the highest priority. If the search is not successful, the hardware generates a signal that indicates a mismatch (or no match).

The comparison circuitry 1115 then compares the results generated by each logical TCAM and determines whether the two results are the same (e.g., if both logical TCAMs generate a no match signal or both logical TCAMs generate a match signal as well as the same search result). If the two logical TCAMs did not generate the same results, the comparison circuitry 1115 sets the error indicator signal 1130 to indicate an error and the search result would be invalid. Otherwise, the comparison circuitry 1115 sets the error indicator signal 30 to indicate no error and provides the search results 1115 (e.g., an address returned by both logical TCAMs) as the search results. In some embodiments, an error indicator generated in a match-action stage of an MAU is sent to the following match-action stages and each match-action stage determines (e.g., based on pre-programmed firmware) what actions should be taken in the light of the error signal generated from a previous stage. For instance, the processing in the next stage may be performed or skipped based on the error signal.

Similar to what was described by reference to error detection in RAM, some embodiments mask the error signal (i.e., signal 1130) generated in TCAMs in order to provide flexibility in utilizing the error signal for different decision makings. The mask allows the user to decide if an error generated by the TCAMs require particular actions (e.g., skipping processing of match tables in subsequent MAU stages).

As shown, there is a shadow write register 1135 between the two logical TCAMs 1105-1110. This register is programmed through software to receive and temporarily store data 1180 that has to be written into each TCAM. The figure also shows a pending write input (e.g., a pending write bit) 1170 that is set to indicate whether to write into the logical TCAM pair immediately or wait for the data for all physical TCAM in the logical TCAM pair to be ready.

Once the data for all physical TCAMs in the logical TCAM pair is ready, in one atomic operation, the shadow write register sends this data (as shown by 1140-1145) to all physical TCAMs in both logical TCAMs such that the two logical TCAMs will have the same information at each clock cycle. Without the shadow write register, for as many cycles that takes to write to TCAM, the two TCAMs would have been out of sync.

The TCAM array of some embodiments is provided in a chip that is programmable and allows the TCAMs to be selectively grouped in logical TCAMs. Since mirroring of TCAM as shown in FIG. 11 require twice as much resources as utilizing the TCAMs individually, the programmable TCAM array provides the option to selectively mirror TCAMs only for the most critical portion of a particular application.

The architecture allows this because a TCAM is not tied to a specific function. It is up to the consumer to define what functions are required and what resources are needed for a particular application for which the TCAM array is used. The programmable architecture provides flexibility to the user to decide, e.g., which tables in the match-action stages of an MAU are critical and to use mirrored TCAMs to implement those tables. At the manufacturing time, none of the TCAMs are hardcoded to any specific functionality. Mirroring the TCAMs is optional and the user does not have to pay the cost everywhere. The user can decide where to double the resources based on the criticality of tables implemented by each TCAM.

Although FIG. 11 is described by reference to logical TCAMs, it should be understood that the same technique could be used by mirroring two TCAMs without defining logical TCAMs. For instance, in FIG. 11, each of logical TCAM 1105 and logical TCAM 1110 can be one physical TCAM selected from TCAM array 800 in FIG. 8 without defining them as a "logical" TCAM. The two physical TCAMs can be mirrored as shown in FIG. 11 in order to provide error detection.

Figure 12:
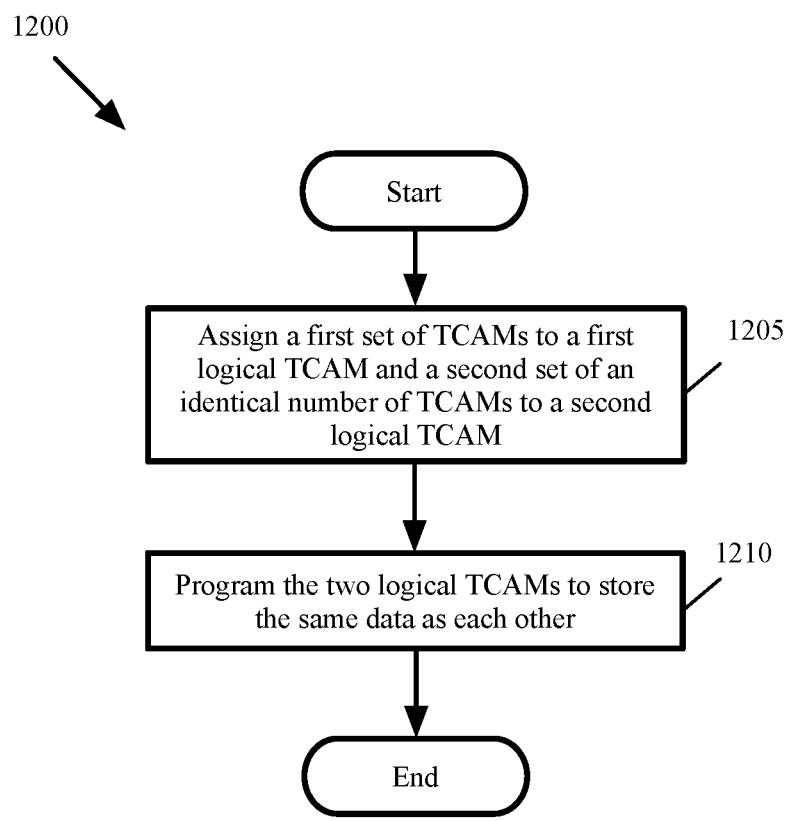
FIG. 12 conceptually illustrates a process for grouping TCAMs to provide data plane error detection in some embodiments.

FIG. 12 conceptually illustrates a process 1200 for grouping TCAMs to provide data plane error detection in some embodiments. The process in some embodiments is programmatically performed after the TCAMs are manufactured. The process in some embodiments utilizes a programming language that is that is designed to program packet forwarding data planes in order to program the match-action tables. For instance, some embodiments utilize a programming language such as P4, which is used for programming protocol-independent packet processors. P4 language works in conjunction with protocols such as OpenFlow and is designed to program the match-action tables.

As shown, the process assigns (at 1205) a first set of TCAMs to a first logical TCAM and a second set of an identical number of TCAMs to a second logical TCAM. For instance, the process assigns one or more physical TCAMs to the first logical TCAM and the same number of physical TCAMs to the second logical TCAM. The physical TCAMs in the second logical TCAM are different than the physical TCAMs in the first logical TCAM.

The process then programs (at 1210) the two TCAMs to store the same data as each other. For instance, each word in the first logical TCAM is programmed to have the same data as a corresponding word in the second logical TCAM. The process then ends. Although process 1200 is described by reference to logical TCAMs, it should be understood that the same technique could be used by mirroring two TCAMs without defining logical TCAMs. For instance, instead using two logical TCAMs, the process in some embodiments selects two physical TCAMs and then programs the two physical TCAMs such that each word of the first physical TCAM has the same information as a corresponding word of the second physical TCAM.

Figure 13:
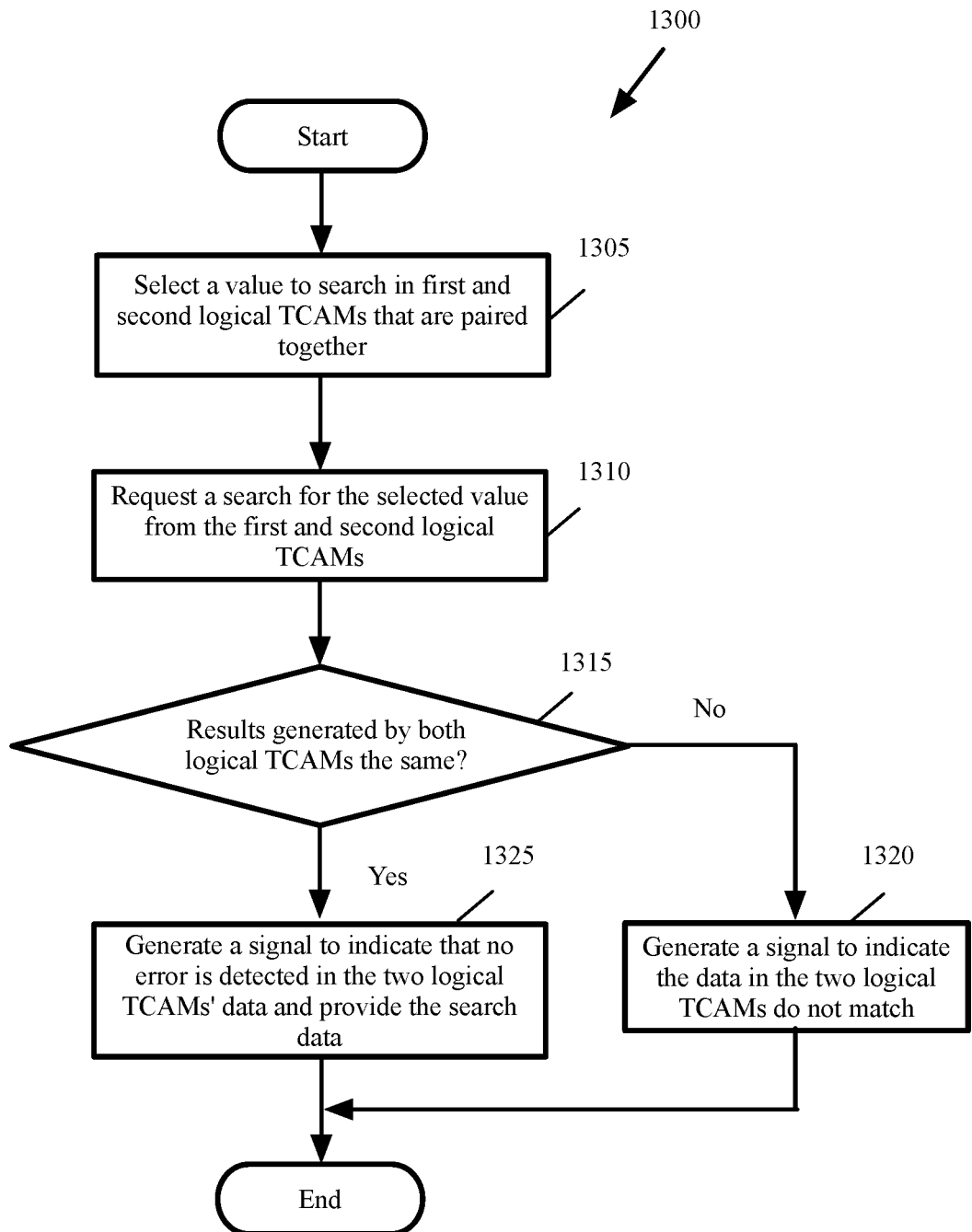
FIG. 13 conceptually illustrates a process for providing data plane error detection for TCAMs in some embodiments.

FIG. 13 conceptually illustrates a process 1300 for providing data plane error detection for TCAMs in some embodiments. The process in some embodiments is performed by hardware and firmware of a TCAM array such as the TCAM array 800 in FIG. 8. The process is performed on two sets of mirrored TCAMs. For example, the process is performed on two logical TCAMs each with the same number of physical TCAMs and the same data stored in the corresponding words of the logical TCAMs. Alternatively, the process can be performed on two mirrored physical TCAMs, where the corresponding words of each physical TCAM storing the identical data. For brevity, the process is described by reference to two mirrored logical TCAMs. The same description applies when two physical TCAMs are mirrored.

As shown, the process selects (at 1305) a value to search in first and second logical TCAMs that are paired together. For instance, the first and second logical TCAMs are similar to the mirrored logical TCAMs 1105 and 1110 in FIG. 11. The value to search can, for instance, be the values in a set of header fields of a packet that is being processed by a physical forwarding element that utilizes the TCAMs as described above by reference to FIGS. 8-11. The value can also be a value from a set of one or more values that are used to periodically perform a search in the TCAMs in order to perform health check for the TCAMs.

The process then requests (at 1310) a search for the selected value from the first and second logical TCAMs. The process then determines (at 1315) whether the results generated by both logical TCAMs are the same. For instance, each logical TCAM hardware searches the content stored in the TCAM. If the search is successful, the hardware in each logical TCAM generates a signal that indicates a match and returns the result with the highest priority. If the search is not successful, the hardware generates a signal that indicates a mismatch (or no match).

The hardware then compares the results generated by each logical TCAM (e.g., by using the comparison circuitry 1115 in FIG. 11). If both logical TCAMs generated the same results (e.g., returned the same address as the result of the search or both indicated a mismatch), the hardware sets an error indicator signal (e.g., error indicator signal 1130 in FIG. 11) to indicate no error and returns the search result (e.g., the search result 1150 in FIG. 11). If the two logical TCAMs did not generate the same results, the hardware would set the error indicator signal to indicate an error and the search result would be invalid.

When the results generated by the two logical TCAMs match, process 1300 generates (at 1325) a signal to indicate the data in the two TCAMs are valid and provided the search results. For instance, the hardware and firmware in FIG. 11 sets error indicator signal 1130 to indicate no error and provides the search results 1150. The process then ends.

Otherwise, when the results generated by the two logical TCAMs do not match, the process generates a signal to indicate the data in the two logical TCAMs do not match. This signal is used, for instance, to generate an interrupt to a processing unit in the forwarding element to allow software to re-write data to into the two logical TCAMs. The signal in some embodiments is also provided to subsequent stages (if any) of the MAU in order to determine whether or not the processing of the MAU tables in the subsequent stages are to be selectively performed or skipped. The process then ends.

Since all 512 hit results are generated in a single clock cycle and fed into a priority encoder, the search operation checks all TCAM contents in parallel. The TCAM array described by reference to FIGS. 8-13 allows the health check of the mirrored TCAMs after each search and finds errors in the TCAM hardware. The errors are detected right away without requiring a sweeping mechanism. As soon as the two logical TCAMs get a mismatch, the processing unit gets an interrupt. Some embodiments perform process 1300 as a part of performing health check in a periodic basis. In contrast, in prior art this kind of error is not detected until there is a sweep to read all TCAM locations to find out whether there is a problem.

III. Computer System

Figure 14:
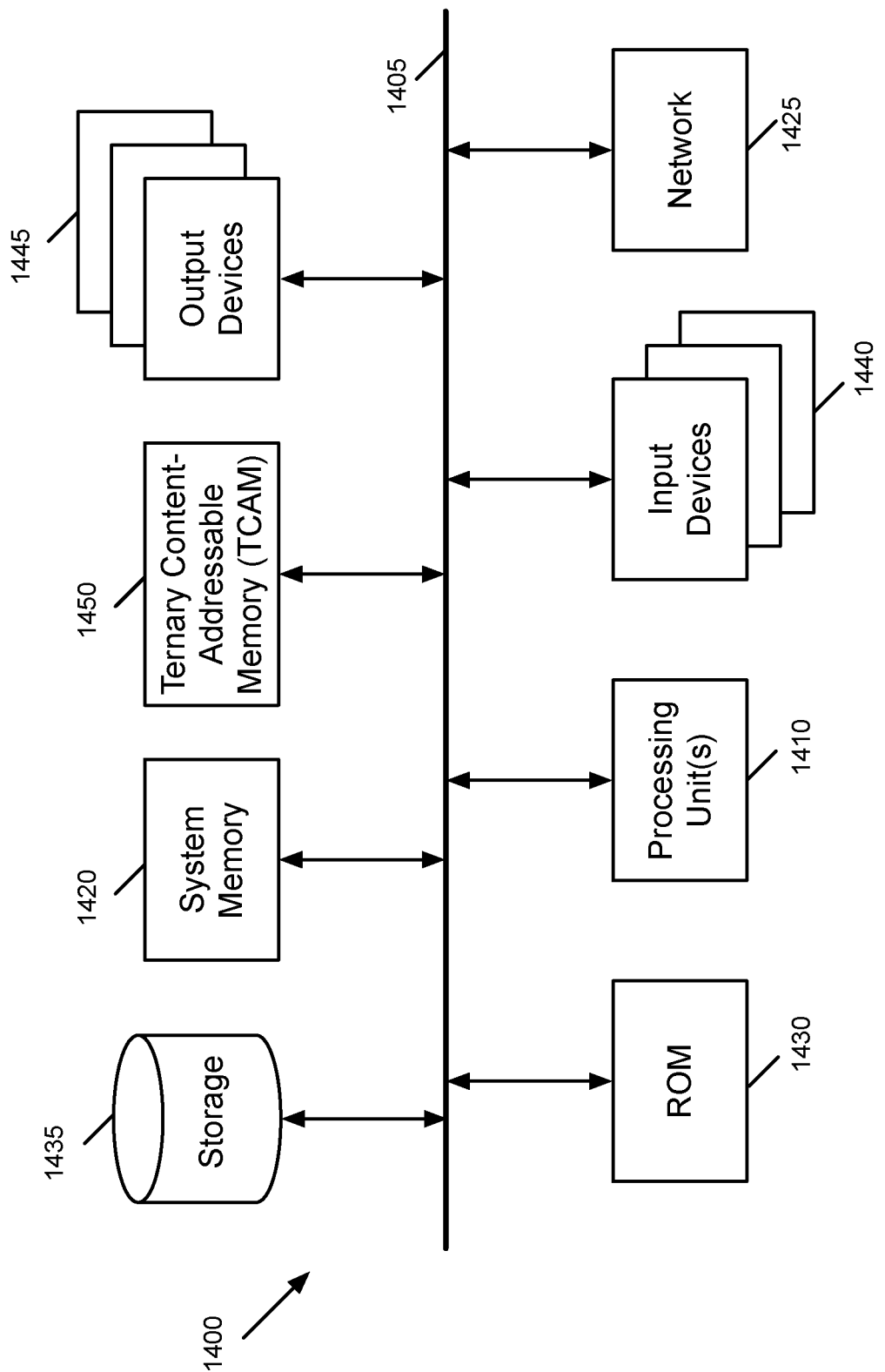
FIG. 14 conceptually illustrates an electronic system with which some embodiments of the invention are implemented.

FIG. 14 conceptually illustrates an electronic system 1400 with which some embodiments of the invention are implemented. The electronic system 1400 can be used to execute any of the control, virtualization, or operating system applications described above. The electronic system 1400 may be a computer (e.g., desktop computer, personal computer, tablet computer, server computer, mainframe, blade computer etc.), phone, PDA, or any other sort of electronic device. Such an electronic system includes various types of computer readable media and interfaces for various other types of computer readable media. Electronic system 1400 includes a bus 1405, processing unit(s) 1410, system memory 1420, read-only memory (ROM) 1430, permanent storage device 1435, input devices 1440, output devices 1445, and TCAM 1450.

The bus 1405 collectively represents all system, peripheral, and chipset buses that communicatively connect the numerous internal devices of the electronic system 1400. For instance, the bus 1405 communicatively connects the processing unit(s) 1410 with the read-only memory 1430, the system memory 1420, and the permanent storage device 1435.

From these various memory units, the processing unit(s) 1410 retrieve instructions to execute and data to process in order to execute the processes of the invention. The processing unit(s) may be a single processor or a multi-core processor in different embodiments.

The read-only-memory 1430 stores static data and instructions that are needed by the processing unit(s) 1410 and other modules of the electronic system. The permanent storage device 1435, on the other hand, is a read-and-write memory device. This device is a non-volatile memory unit that stores instructions and data even when the electronic system 1400 is off. Some embodiments of the invention use a mass-storage device (such as a magnetic or optical disk and its corresponding disk drive) as the permanent storage device 1435.

Other embodiments use a removable storage device (such as a floppy disk, flash drive, etc.) as the permanent storage device. Like the permanent storage device 1435, the system memory 1420 is a read-and-write memory device. However, unlike storage device 1435, the system memory is a volatile read-and-write memory, such a random access memory. The system memory stores some of the instructions and data that the processor needs at runtime. In some embodiments, the invention's processes are stored in the system memory 1420, the permanent storage device 1435, and/or the read-only memory 1430. From these various memory units, the processing unit(s) 1410 retrieve instructions to execute and data to process in order to execute the processes of some embodiments.

The bus 1405 also connects to the input and output devices 1440 and 1445. The input devices enable the user to communicate information and select commands to the electronic system. The input devices 1440 include alphanumeric keyboards and pointing devices (also called "cursor control devices"). The output devices 1445 display images generated by the electronic system. The output devices include printers and display devices, such as cathode ray tubes (CRT) or liquid crystal displays (LCD). Some embodiments include devices, such as a touchscreen, that function as both input and output devices.

Finally, as shown in FIG. 14, bus 1405 also couples electronic system 1400 to a network 1425 through a network adapter (not shown). In this manner, the computer can be a part of a network of computers (such as a local area network ("LAN"), a wide area network ("WAN"), an Intranet, or a network of networks, such as the Internet. Any or all components of electronic system 1400 may be used in conjunction with the invention.

Some embodiments include electronic components, such as microprocessors, storage, and memory, which store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. In addition, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process.

In view of the foregoing, one of ordinary skill in the art would understand that the invention is not to be limited by the foregoing illustrative details, but rather is to be defined by the appended claims.

What is claimed is:

1. A data-plane circuit for forwarding packets received by a forwarding element, the data-plane circuit comprising:
a plurality of unit memories, a set of packet processing pipelines, and an error signal fabric,
each packet processing pipeline comprising a plurality of match action stages,
each match action stage comprising a set of match action tables stored in a set of unit memories; and
each unit memory configured to detect an error in the unit memory, and to generate an error output when an error is detected in the memory unit,
the error signal fabric configured (i) to combine, for each match action stage, error outputs of the unit memories storing match tables into a first bit in the error signal fabric, and (ii) to combine, for each match action stage, error outputs of the unit memories storing action tables into a second bit in the error signal fabric.

2. The data-plane circuit of claim 1, the error signal fabric further configured to forward each error signal bit to a next match action stage of the forwarding element.

3. The data-plane circuit of claim 1, wherein the plurality of match action stages process a set of header fields of a packet received at the forwarding element, the forwarding element configured to skip a processing of a packet when a unit memory generates an error signal.

4. The data-plane circuit of claim 1, the error signal fabric further configured to combine the first and second bits into a single error bit.

5. The data-plane circuit of claim 1, wherein errors detected in a unit memory storing a match table comprise parity errors and double bit error correcting code (ECC).

6. The data-plane circuit of claim 1 further comprising a plurality of ternary content-addressable memory units, wherein a set of unit memories are configured to store data associated with a TCAM address as a ternary indirection (TIND), the error signal fabric further configured to combine error outputs of the unit memories storing TIND data into the first bit in the error signal fabric.

7. The data-plane circuit of claim 1, wherein errors detected in a unit memory storing an action table comprise double bit error correcting code (ECC).

8. The data-plane circuit of claim 1 further comprising:
a set of arithmetic logic units (ALUs); and
an instruction memory to store instructions to feed the ALUs, wherein the error signal fabric further configured to combine parity errors generated by the instruction memory into the second bit in the error signal fabric.

9. The data-plane circuit of claim 1, wherein the unit memories are static random-access memory (SRAM).

10. The data-plane circuit of claim 1, wherein the forwarding element comprises a control-plane circuit to configure the data-plane circuit.

11. A non-transitory machine readable medium storing a program for detecting error in a data plane circuit of a forwarding element comprising a plurality of physical unit memories, an error signal fabric, and a set of packet processing pipelines, each packet processing pipeline comprising a plurality of match action stages, each match action stage comprising a set of match action tables, the program comprising sets of instructions for:
configuring a set of physical unit memories to store the set of match action tables;
configuring each unit memory to generate an error output when an error is detected in the memory unit;
configuring each match action stage to combine error outputs of the unit memories storing match tables into a first bit in the error signal fabric, and to combine error outputs of the unit memories storing action tables into a second bit in the error signal fabric.

12. The non-transitory machine readable medium of claim 11, wherein the program further comprises a set of instructions for forwarding each error signal bit to a next match action stage of the forwarding element.

13. The non-transitory machine readable medium of claim 11, wherein the plurality of match action stages process a set of header fields of a packet received at the forwarding element, the program further comprising a set of instructions for skipping a processing of a packet when a unit memory generates an error signal.

14. The non-transitory machine readable medium of claim 11, wherein the program further comprises a set of instructions for combining the first and second bits into a single error bit.

15. The non-transitory machine readable medium of claim 11, wherein errors detected in a unit memory storing a match table comprise parity errors and double bit error correcting code (ECC).

16. The non-transitory machine readable medium of claim 11, the data plane circuit further comprising a plurality of ternary content-addressable memory units, wherein the program further comprises a set of instructions for:
storing data associated with a TCAM address as a ternary indirection (TIND) in a set of unit memories, and
combining error outputs of the unit memories storing TIND data into the first bit in the error signal fabric.

17. The non-transitory machine readable medium of claim 11, wherein errors detected in a unit memory storing an action table comprise double bit error correcting code (ECC).

18. The non-transitory machine readable medium of claim 11, wherein the data plane circuit further comprises a set of arithmetic logic units (ALUs) and an instruction memory to store instructions to feed the ALUs, wherein the program further comprises a set of instructions for combining parity errors generated by the instruction memory into the second bit in the error signal fabric.

19. The non-transitory machine readable medium of claim 11, wherein the unit memories are static random-access memory (SRAM).

20. The non-transitory machine readable medium of claim 11, wherein the forwarding element is one of a switch and a router.

* * * * *